US011070207B2

(12) United States Patent
Huang

(10) Patent No.: US 11,070,207 B2
(45) Date of Patent: Jul. 20, 2021

(54) BOOTSTRAPPED SWITCH

(71) Applicant: REALTEK SEMICONDUCTOR CORPORATION, Hsinchu (TW)

(72) Inventor: Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/062,813

(22) Filed: Oct. 5, 2020

(65) Prior Publication Data

US 2021/0105014 A1 Apr. 8, 2021

(30) Foreign Application Priority Data

Oct. 8, 2019 (TW) ................................ 108136415

(51) Int. Cl.
*H03K 17/06* (2006.01)
*H03K 19/017* (2006.01)
*H03K 19/096* (2006.01)

(52) U.S. Cl.
CPC ..... *H03K 19/01735* (2013.01); *H03K 17/063* (2013.01); *H03K 19/01714* (2013.01); *H03K 19/0963* (2013.01)

(58) Field of Classification Search
CPC ......... H03K 19/01735; H03K 19/0963; H03K 17/063; H03K 19/01742; H03K 19/01728; H03K 19/01714
See application file for complete search history.

(56) References Cited

U.S. PATENT DOCUMENTS 6,525,574 B1 2/2003 Herrera
9,584,112 B2* 2/2017 Tang .................... H03K 17/687

FOREIGN PATENT DOCUMENTS

EP 2779451 A1 9/2014

OTHER PUBLICATIONS

Bootstrapped switch, Paul R. Gray et al., Improvement of Bootstrapped Switch using Trackand Precharge Phase et al., 1995-2013 Iscas et al.
M. Dessouky et al., "Switch Sizing for Very Low-Voltage Switched-Capacitor Circuits", 2001 IEEE, pp. 1549-1552.
(Continued)

*Primary Examiner* — Jung Kim
(74) *Attorney, Agent, or Firm* — WPAT, PC

(57) ABSTRACT

A bootstrapped switch is provided. The bootstrapped switch includes a first transistor, a second transistor, a capacitor and five switches. The first transistor receives an input voltage and outputs an output voltage. A first terminal of the second transistor receives the input voltage, and a second terminal of the second transistor is coupled to a first terminal of the capacitor. In a first clock phase, the capacitor is being charged. In a second clock phase, the control terminal of the first transistor and the control terminal of the second transistor are substantially equipotential with a second terminal of the capacitor. The control terminal of the first transistor and the control terminal of the second transistor are coupled to the power supply voltage within a predetermined time before the terminal of the first clock phase or within a predetermined time after the start of the second clock phase.

10 Claims, 8 Drawing Sheets

(56) References Cited

OTHER PUBLICATIONS

MOS_Juction_cap_well_body_cap, "MOSFET Capacitances", Jan. 13, 2003, 97.477 Lecture.
Nice_PPT_Bootstrap SW, Ref: Dessouky and Kaiser, Input Sampling Bootstrapping SW, Mar. 2001 p. 1-8, Oregon State University, JSSC.
Mohamed Dessouky and Andreas Kaiser, 2001JSSC_Very Low-Voltage Digital-Audio Delta-Sigma Modulator with 88-dB Dynamic Range Using Local Switch Bootstrapping, March 2001, pp. 349-355, vol. 36, No. 3, IEEE Journal of Solid-State Circuits.
Andrew M. Abo and Paul R. Gray, "A 1.5-V, 10-bit, 14.3-Ms-s CMOS Pipeline Analog-to-Digital Converter", May 1999, pp. 599-606, vol. 34, No. 5, IEEE Journal of Solid-State Circuits.
OA letter of the counterpart TW application (appl. No. 108136415) mailed on Mar. 30, 2020. Summary of the OA letter: Claim 10 is rejected under Taiwan Patent Law Article 22(2) as being unpatentable over reference 1 (Switch sizing for very low-voltage switched-capacitor circuits) and reference 2 (U.S. Pat. No. 6,525,574 B1).
M. Dessouky, M. -. Louerat and A. Kaiser, "Switch sizing for very low-voltage switched-capacitor circuits," ICECS 2001. 8th IEEE International Conference on Electronics, Circuits and Systems (Cat. No. 01EX483), Malta, 2001, pp. 1549-1552 vol. 3.

\* cited by examiner

BOOTSTRAPPED SWITCH

BACKGROUND OF THE INVENTION

1. Field of the Invention

The present disclosure generally relates to bootstrapped switches, and more particularly, to bootstrapped switches with high linearity.

2. Description of Related Art

FIG. 1 is a circuit diagram of a conventional bootstrapped switch. The bootstrapped switch 10 includes a switch 101, a switch 102, a switch 103, a switch 104, a switch 105, an N-type metal-oxide-semiconductor field-effect transistor (N-type MOSFET, hereinafter referred to as NMOS) 106 and a bootstrap capacitor 107. The input VI and output VO of the bootstrapped switch 10 are respectively coupled to the source and drain of the NMOS 106. The gate of the NMOS 106 is coupled to the voltage source V3 through the switch 105 and coupled to one terminal of the bootstrap capacitor 107 and one terminal of the switch 101 through the switch 104. The other terminal of the switch 101 is coupled to the voltage source V1. The other terminal of the bootstrap capacitor 107 is coupled to the voltage source V2 through the switch 102 and coupled to the source of the NMOS 106 and the input VI of the bootstrapped switch 10 through the switch 103. The voltage source V1 is a high-voltage VDD (greater than zero), while the voltage source V2 and the voltage source V3 are ground. The operation details of the bootstrapped switch 10 are well known to people having ordinary skill in the art and are thus omitted for brevity.

Bootstrapped switches have the advantage of high linearity. However, when the switches in the bootstrapped switch are implemented with transistors (e.g., MOSFETs or bipolar junction transistors (BJTs)), the parasitic capacitors of the transistors often cause unwanted discharge of the bootstrap capacitor in the bootstrapped switch, resulting in a drop in the linearity of the bootstrapped switch.

SUMMARY OF THE INVENTION

In view of the issues of the prior art, an object of the present disclosure is to provide bootstrapped switches with high linearity, so as to make an improvement to the prior art.

A bootstrapped switch is provided. The bootstrapped switch receives an input voltage and outputs an output voltage, and includes a first transistor, a capacitor, a second transistor, a first switch, a second switch, a third switch, a fourth switch and a fifth switch. The first transistor has a first terminal, a second terminal and a first control terminal The first terminal receives the input voltage, and the second terminal outputs the output voltage. The capacitor has a third terminal and a fourth terminal The second transistor has a fifth terminal, a sixth terminal and a second control terminal. The fifth terminal receives the input voltage, the sixth terminal is electrically connected to the third terminal of the capacitor, and the second control terminal is electrically connected to the first control terminal of the first transistor. The first switch is coupled between the third terminal of the capacitor and a first reference voltage. The second switch is coupled between the fourth terminal of the capacitor and a second reference voltage. The third switch is coupled between the fourth terminal of the capacitor and the first control terminal of the first transistor. The fourth switch is coupled between the first control terminal of the first transistor and the first reference voltage. The fifth switch is coupled between the first control terminal of the first transistor and the second reference voltage. The capacitor is charged in a first clock phase with the first switch, the second switch and the fourth switch being turned on and the third switch being turned off. In a second clock phase, the third switch is turned on, and the first switch, the second switch and the fourth switch are turned off, so that the first control terminal of the first transistor and the fourth terminal of the capacitor are substantially equipotential. The fifth switch is turned on in a preset time interval before the first clock phase ends or after the second clock phase starts, so that the first control terminal of the first transistor and the second control terminal of the second transistor are coupled to the second reference voltage in the preset time interval.

A bootstrapped switch is also provided. The bootstrapped switch receives an input voltage and outputs an output voltage, and includes a first transistor, a first capacitor, a second transistor, a first switch, a third transistor, a fourth transistor, a second switch and a second capacitor. The first transistor has a first terminal, a second terminal and a first control terminal The first terminal receives the input voltage, and the second terminal outputs the output voltage. The first capacitor has a third terminal and a fourth terminal. The second transistor has a fifth terminal, a sixth terminal and a second control terminal The fifth terminal receives the input voltage, the sixth terminal is electrically connected to the third terminal of the first capacitor, and the second control terminal is electrically connected to the first control terminal of the first transistor. The first switch is coupled between the third terminal of the first capacitor and a first reference voltage. The third transistor has a seventh terminal, an eighth terminal and a first bulk. The seventh terminal is coupled to a second reference voltage, and the eighth terminal is coupled to the fourth terminal of the first capacitor. The fourth transistor has a ninth terminal, a tenth terminal and a second bulk. The ninth terminal is coupled to the first control terminal of the first transistor, and the tenth terminal is coupled to the fourth terminal of the first capacitor. The second switch is coupled between the first control terminal of the first transistor and the first reference voltage. The second capacitor has an eleventh terminal and a twelfth terminal. The twelfth terminal is electrically connected to the first bulk and/or the second bulk. The first capacitor is charged in a first clock phase with the first switch being turned on, the third transistor being turned on, the second switch being turned on, and the fourth transistor being turned off. In a second clock phase, the fourth transistor is turned on, the first switch is turned off, the third transistor is turned off, and the second switch is turned off, so that the first control terminal of the first transistor and the fourth terminal of the first capacitor are substantially equipotential. The second capacitor is charged in the first clock phase, the eleventh terminal of the second capacitor is coupled to a third reference voltage in the second clock phase, and in the second clock phase a sum of a first voltage across the first capacitor and the input voltage is less than or equal to a sum of a second voltage across the second capacitor and the third reference voltage.

A bootstrapped switch which has an input terminal and an output terminal is also provided. The bootstrapped switch includes a first transistor, a capacitor, a second transistor, multiple switches and a target switch. The first transistor is coupled between the input terminal and the output terminal and has a first control terminal The capacitor has a first terminal and a second terminal. The second transistor is coupled between the input terminal and the first terminal of the capacitor and has a second control terminal The second control terminal is electrically connected to the first control terminal of the first transistor. The switches are coupled to the first control terminal of the first transistor, the second control terminal of the second transistor, the first terminal of the capacitor, the second terminal of the capacitor, a first reference voltage and a second reference voltage. The switches include a first group and a second group. The target switch is coupled between the first control terminal of the first transistor and the second reference voltage. The capacitor is charged in a first clock phase with the first group of the switches being turned on and the second group of the switches being turned off. In a second clock phase, the first group of the switches is turned off, and the second group of the switches is turned on, so that the first control terminal of the first transistor and the second terminal of the capacitor are substantially equipotential. The target switch is turned on in a preset time interval before the first clock phase ends or after the second clock phase starts, so that the first control terminal of the first transistor and the second control terminal of the second transistor are coupled to the second reference voltage in the preset time interval.

The bootstrapped switches in this disclosure can diminish the influence of the parasitic capacitors of the transistors on the bootstrap capacitor. Compared with the traditional technology, the bootstrapped switches of this disclosure have higher linearity.

These and other objectives of the present disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes bootstrapped switches. On account of that some or all elements of the bootstrapped switches could be known, the detail of such elements is omitted provided that such detail has little to do with the features of this disclosure, and that this omission nowhere dissatisfies the specification and enablement requirements. A person having ordinary skill in the art can choose components equivalent to those described in this specification to carry out the present disclosure, which means that the scope of this disclosure is not limited to the embodiments in the specification.

Although the terms "first," "second," etc., may be used herein to describe various elements, these elements should not be limited by these terms. These terms used in this way aim to distinguish one element from another. For example, a first element could be termed a second element, and, similarly, a second element could be termed a first element, without departing from the scope of the embodiments.

For ease of understanding, similar elements in various figures are designated with the same reference numbers.

Figure 1:
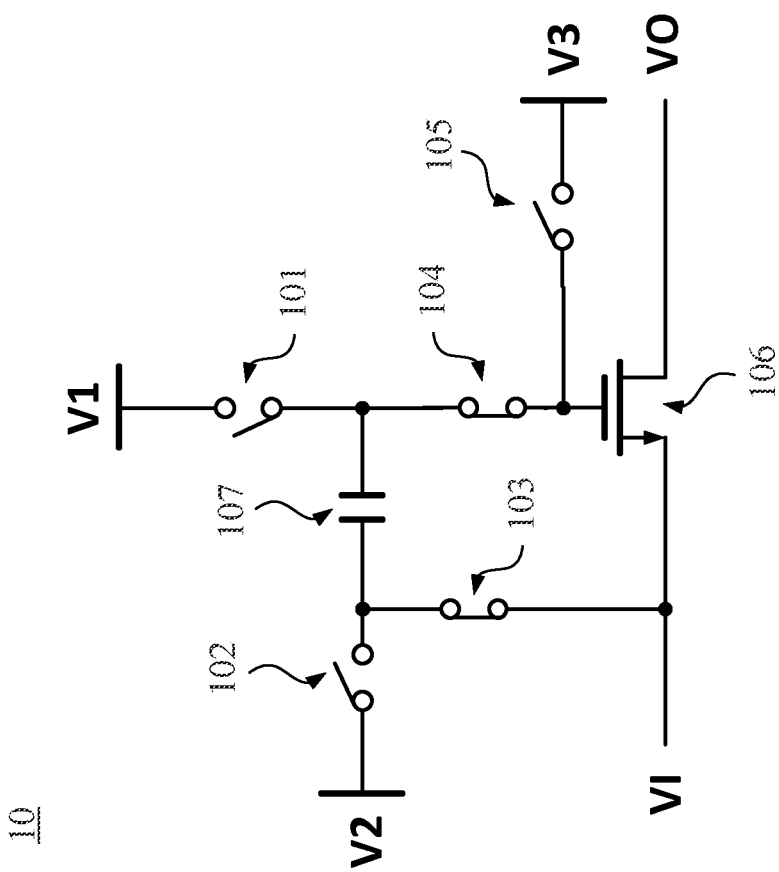
FIG. 1 illustrates a circuit diagram of a conventional bootstrapped switch.
Figure 2:
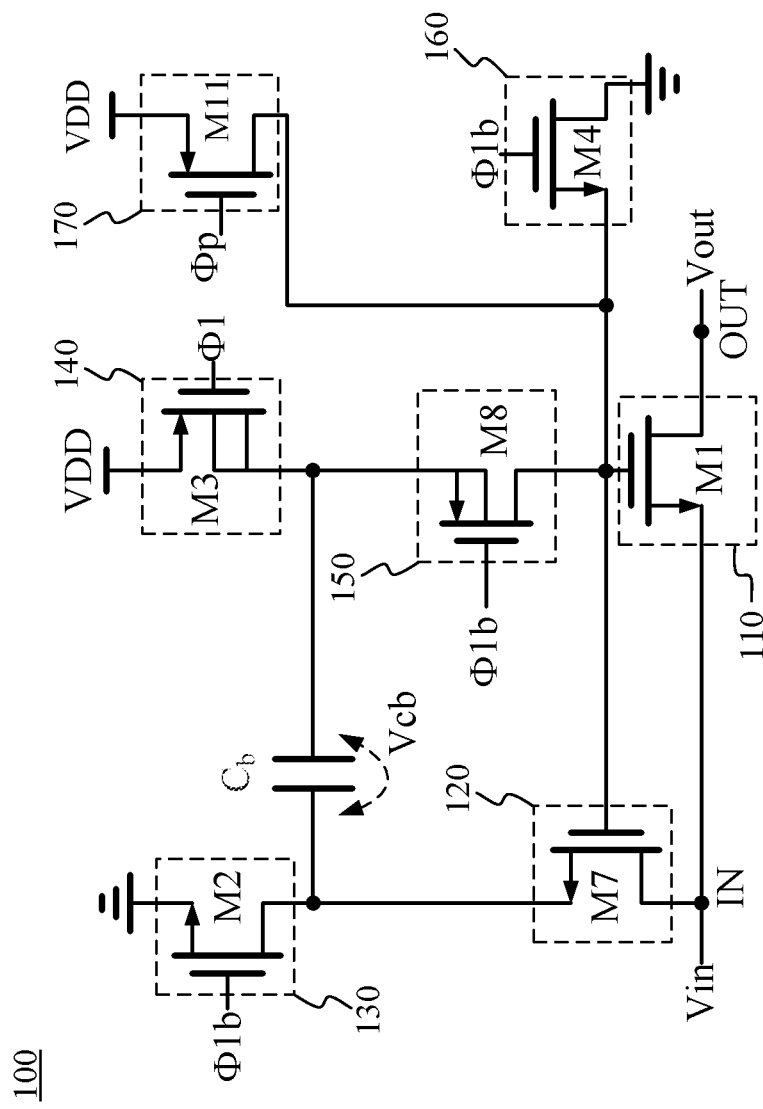
FIG. 2 illustrates a circuit diagram of a bootstrapped switch according to an embodiment of this disclosure.

FIG. 2 is a circuit diagram of a bootstrapped switch according to an embodiment of this disclosure. The bootstrapped switch 100 receives the input voltage Vin via the input terminal IN and outputs the output voltage Vout via the output terminal OUT. The bootstrapped switch 100 includes a switch 110, a switch 120, a switch 130, a switch 140, a switch 150, a switch 160, a switch 170 and a bootstrap capacitor $C_b$. The switch 110, switch 120, switch 130, switch 140, switch 150, switch 160 and switch 170 may be implemented with the transistor M1, transistor M7, transistor M2, transistor M3, transistor M8, transistor M4 and transistor M11, respectively. Each transistor has a first terminal, a second terminal and a control terminal. The first terminal and second terminal of a transistor are the two terminals of the corresponding transistor-implemented switch. For MOSFETs, the first terminal is one of the source and the drain while the second terminal is the other, and the control terminal is the gate. For BJTs, the first terminal is one of the collector and the emitter while the second terminal is the other, and the control terminal is the base.

As shown in FIG. 2, in some embodiments, the control terminal of the transistor M1 and the control terminal of the transistor M7 are electrically connected to each other and further electrically connected to the first terminal of the transistor M11. The transistor M1 receives the input voltage Vin at its second terminal, and outputs the output voltage Vout at its first terminal. The first terminal of the transistor M7 receives the input voltage Vin, and the second terminal of the transistor M7 is electrically connected to the first terminal of the bootstrap capacitor $C_b$. The first terminal of the transistor M2 is coupled to the first terminal of the bootstrap capacitor $C_b$, and the second terminal of the transistor M2 is coupled to the first reference voltage, which is ground in the example circuit of FIG. 2. The first terminal of the transistor M3 is coupled to the second terminal of the bootstrap capacitor $C_b$, and the second terminal of the transistor M3 is coupled to the second reference voltage, which is the power supply voltage VDD in the example circuit of FIG. 2. The first terminal of the transistor M8 is coupled to the control terminal of the transistor M1, the control terminal of the transistor M7 and the first terminal of the transistor M11, and the second terminal of the transistor M8 is coupled to the second terminal of the bootstrap capacitor $C_b$. The first terminal of the transistor M4 is coupled to the first reference voltage, and the second terminal of the transistor M4 is coupled to the control terminal of the transistor M1, the control terminal of the transistor M7 and the first terminal of the transistor M11. The first terminal of the transistor M11 is electrically connected to the control terminal of the transistor M1 and the control terminal of the transistor M7, and the second terminal of the transistor M11 is coupled to the second reference voltage, which is the power supply voltage VDD in the example circuit of FIG. 2.

Figure 3:
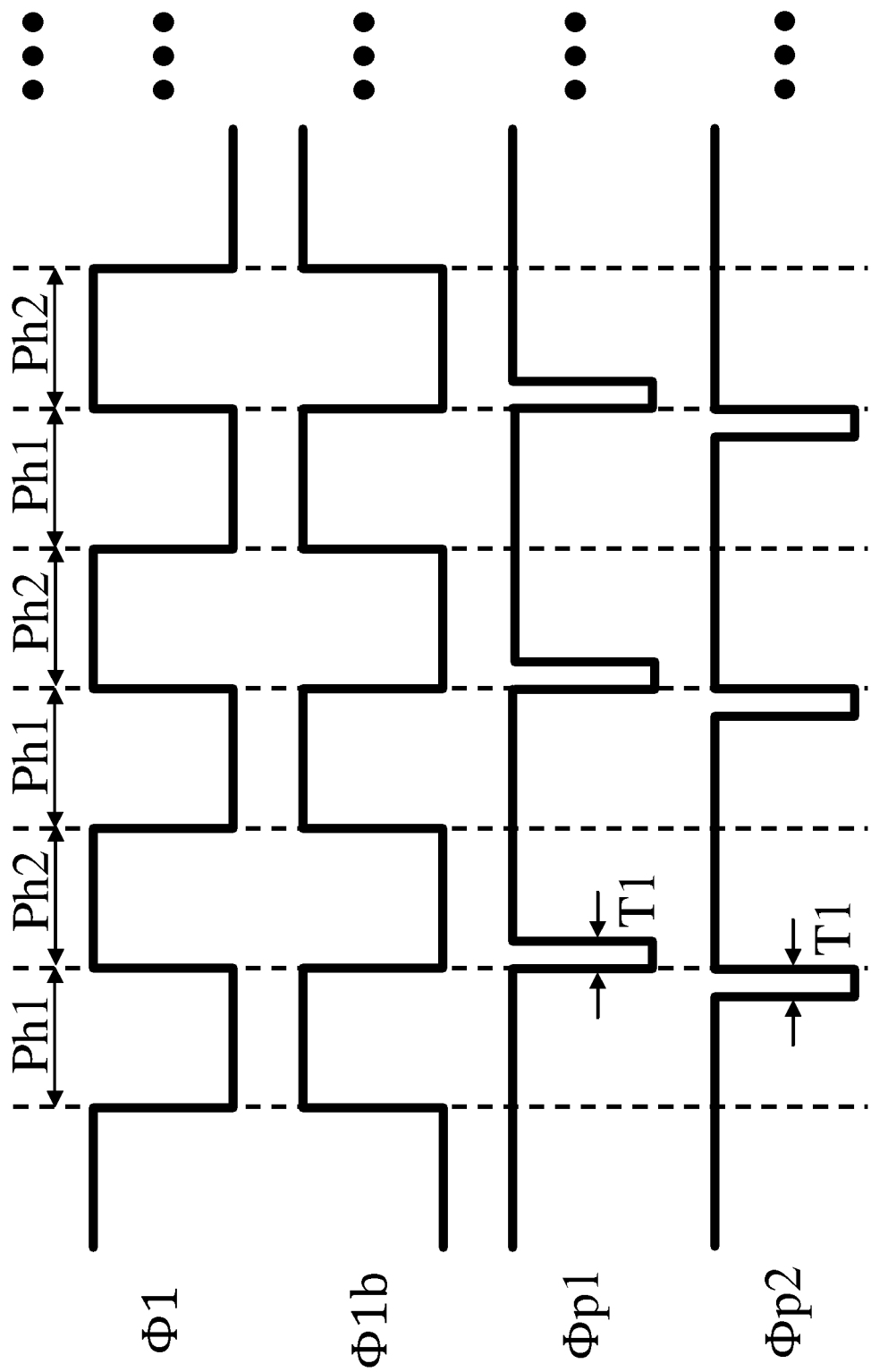
FIG. 3 illustrates the clocks $\Phi 1$, $\Phi 1b$, $\Phi p1$ and $\Phi p2$.

The switch 130, switch 140, switch 150 and switch 160 are turned on or off (i.e., the corresponding transistor is turned on or off) according to the clocks Φ1 and Φ1b. FIG. 3 shows an example of the clock Φ1 and the clock Φ1b, which is the inverse of the clock Φ1. Controlled by the clocks Φ1 and Φ1b, the bootstrapped switch 100 alternately operates in the first clock phase Ph1 (i.e., the clock Φ1 being at the low level and the clock Φ1b being at the high level) and the second clock phase Ph2 (i.e., the clock Φ1 being at the high level and the clock Φ1b being at the low level). The switch 170 is controlled by the clock Φp. In some embodiments, the clock Φp is at the low level in a preset time interval T1 after the second clock phase Ph2 starts, as illustrated by the clock Φp1 in FIG. 3. In other embodiments, the clock Φp is at the low level in a preset time interval T1 before the first clock phase Ph1 ends, as illustrated by the clock Φp2 in FIG. 3. In other words, the switch 170 is turned on in the preset time interval T1 before and/or after the transition time point at which a transition from the first clock phase Ph1 to the second clock phase Ph2 occurs, resulting in the electric potentials of the control terminals of the transistor M1 and transistor M7 being substantially equal to the second reference voltage (VDD) in the preset time interval T1. In some embodiments, the length of the preset time interval T1 may be set to the time period from the start of the second clock phase Ph2 to the transistor M8 being completely turned on. When the transistor M8 is completely turned on, its first terminal and second terminal are substantially equipotential. The operation of the bootstrapped switch 100 is discussed in detail below.

In some embodiments, the switch 170 may also be referred to as a target switch.

In reference to FIG. 2 and FIG. 3, in the first clock phase Ph1, the switch 160, switch 130 and switch 140 are turned on, while the switch 150 is turned off. When the switch 160 is turned on, the voltages of the control terminals of the transistor M1 and transistor M7 are substantially equal to the first reference voltage, causing the switch 110 and switch 120 to be turned off. In other words, when the switch 170 is not taken into consideration (i.e., when the preset time interval T1 is not considered), the switch 110 and switch 120 are turned off in the first clock phase Ph1. When the switch 130 and switch 140 are turned on, the voltages of the two terminals of the bootstrap capacitor Cb are substantially the first reference voltage and the second reference voltage, respectively. In other words, the bootstrap capacitor Cb is charged in the first clock phase Ph1, and the voltage Vcb across the bootstrap capacitor Cb is substantially equal to the voltage difference between the first reference voltage and the second reference voltage after the first clock phase Ph1 ends.

In the second clock phase Ph2, the switch 160, switch 130 and switch 140 are turned off, while the switch 150 is turned on. When the switch 150 is turned on, the control terminals of the transistor M1 and transistor M7 are substantially equipotential to the second terminal of the bootstrap capacitor $C_b$; therefore, the transistor M1 and transistor M7 are turned on by the voltage Vcb across the bootstrap capacitor $C_b$. When the transistor M7 is turned on, the voltages of the second terminal of the bootstrap capacitor $C_b$ and the control terminal of the transistor M1 are substantially equal to the sum of the input voltage Vin and the voltage Vcb across the bootstrap capacitor $C_b$. When the transistor M1 is turned on, the output voltage Vout is substantially equal to the input voltage Vin, i.e., the bootstrapped switch 100 is turned on.

Because the switch 170 is turned on in the preset time interval T1 before or after a state of the switch 150 is changed (from turned off to turned on), the control terminals of the transistor M1 and transistor M7 and the first terminal of the transistor M8 substantially receive the second reference voltage before the transistor M8 is completely turned on (i.e., before the control terminal of the transistor M1 and the second terminal of the bootstrap capacitor $C_b$ are substantially equipotential). As a result, the parasitic capacitors of the transistor M1, transistor M7 and transistor M8 are charged by the second reference voltage before the transistor M8 is completely turned on, preventing the charges on the bootstrap capacitor $C_b$ from transferring to these parasitic capacitors after the transistor M8 is completely turned on. Therefore, the linearity of the bootstrapped switch 100 is improved. In other words, because the switch 170 is provided and its turn-on timing is well designed and controlled, when the bootstrapped switch 100 is turned on, the voltage of the control terminal of the transistor M1 is substantially equal to the sum of the input voltage Vin and the voltage Vcb across the bootstrap capacitor $C_b$, that is, the voltage difference between the control terminal of the transistor M1 and the second terminal of the transistor M1 is a constant value (which is substantially equal to the voltage Vcb across the bootstrap capacitor $C_b$ and does not vary with the input voltage Vin) while the bootstrapped switch 100 is turned on. As a result, the linearity of the bootstrapped switch 100 can be ensured.

It should be noted that, in this embodiment, the control terminal of the transistor M7 is electrically connected to the control terminal of the transistor M1, rather than being controlled by the clock Φ1. Such a design can prevent the incomplete turn-on of the transistor M7, which decreases the linearity of the bootstrapped switch 100, in cases where the difference between the input voltage Vin and the high or low voltage level of the clock Φ1 is smaller than the threshold voltage of the transistor M7.

Figure 4:
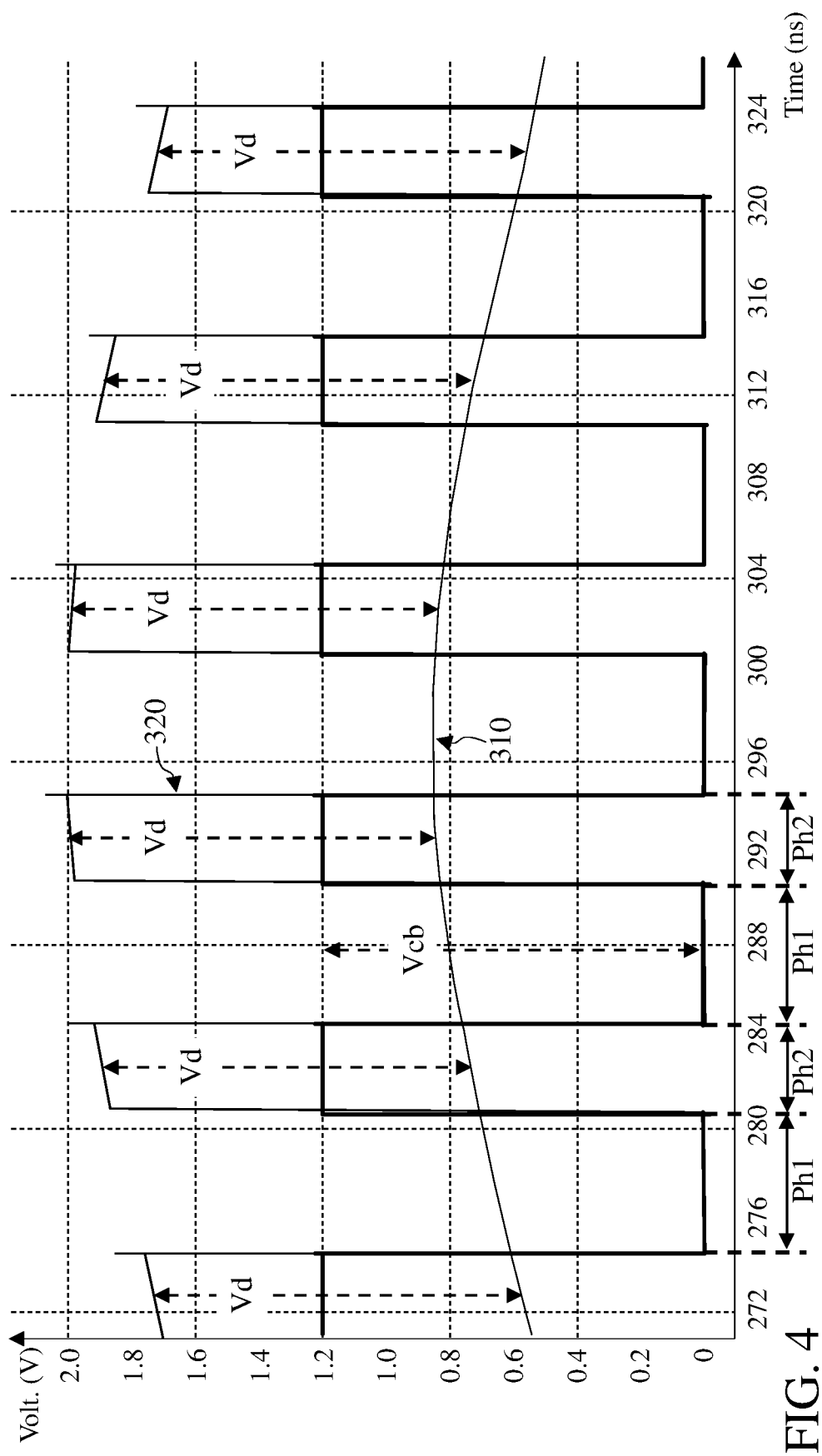
FIG. 4 illustrates an example waveform of the input voltage Vin and the voltage of the control terminal of the transistor M1.

FIG. 4 shows an example waveform of the input voltage Vin and the voltage of the control terminal of the transistor M1. The curve 310 represents the input voltage Vin, and the waveform 320 represents the voltage of the control terminal of the transistor M1. In this example, the first reference voltage is ground whereas the second reference voltage is the power supply voltage VDD (which is 1.2V in this example), and the difference between the two is the voltage Vcb across the bootstrap capacitor $C_b$. The waveform 320 presents a value of 0 (ground) in the first clock phase Ph1 and a sum of the input voltage Vin and the voltage difference Vd in the second clock phase Ph2. In other words, the voltage difference Vd is the boost voltage received at the control terminal of transistor M1. It is observed that the voltage difference Vd is quite close to the voltage Vcb across the bootstrap capacitor $C_b$, which means that there is virtually no loss of the charges on the bootstrap capacitor $C_b$ during the process of the bootstrapped switch 100 being turned on because the parasitic capacitor(s) on the path from the bootstrap capacitor $C_b$ to the control terminal of the transistor M1 has(have) already been substantially fully charged in the preset time interval T1.

Figure 5:
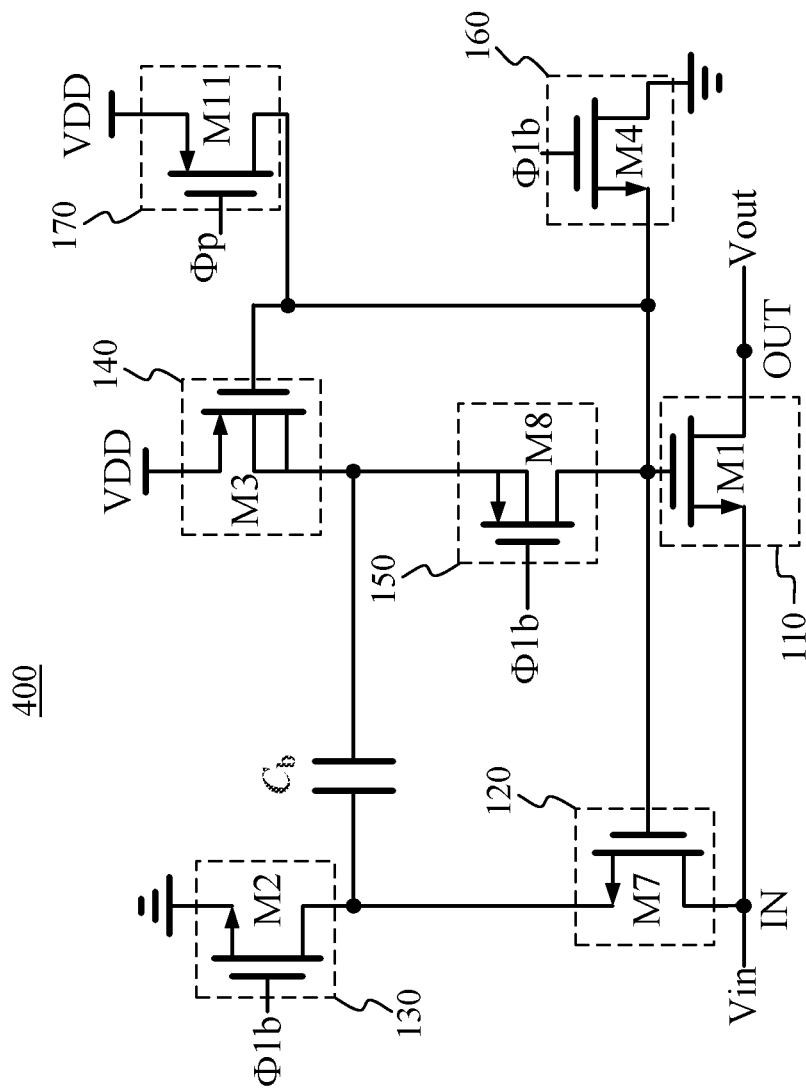
FIG. 5 illustrates a circuit diagram of a bootstrapped switch according to another embodiment of this disclosure.

FIG. 5 is a circuit diagram of a bootstrapped switch according to another embodiment of this disclosure. The bootstrapped switch 400 is similar to the bootstrapped switch 100, except that the control terminal of the transistor M3 is coupled to the switch 170 and the control terminal of the transistor M1. In this design, the voltage of the control terminal of the transistor M3 in the second clock phase Ph2 is not the voltage of the clock Φ1, but is substantially the sum of the input voltage Vin and the voltage Vcb across the bootstrap capacitor $C_b$. Therefore, the charges on the bootstrap capacitor $C_b$ do not transfer to the parasitic capacitor of the transistor M3 while the bootstrapped switch 400 is being turned on because both terminals of the parasitic capacitor of the transistor M3 (which are the control terminal of the transistor M3 and the first or second terminal of the transistor M3) have substantially the same voltage (which is the sum of the input voltage Vin and the voltage Vcb across the bootstrap capacitor $C_b$) in the second clock phase Ph2. As a result, such a design has the benefit that the voltage Vcb across the bootstrap capacitor $C_b$ is not affected by the parasitic capacitor of the transistor M3.

Figure 6:
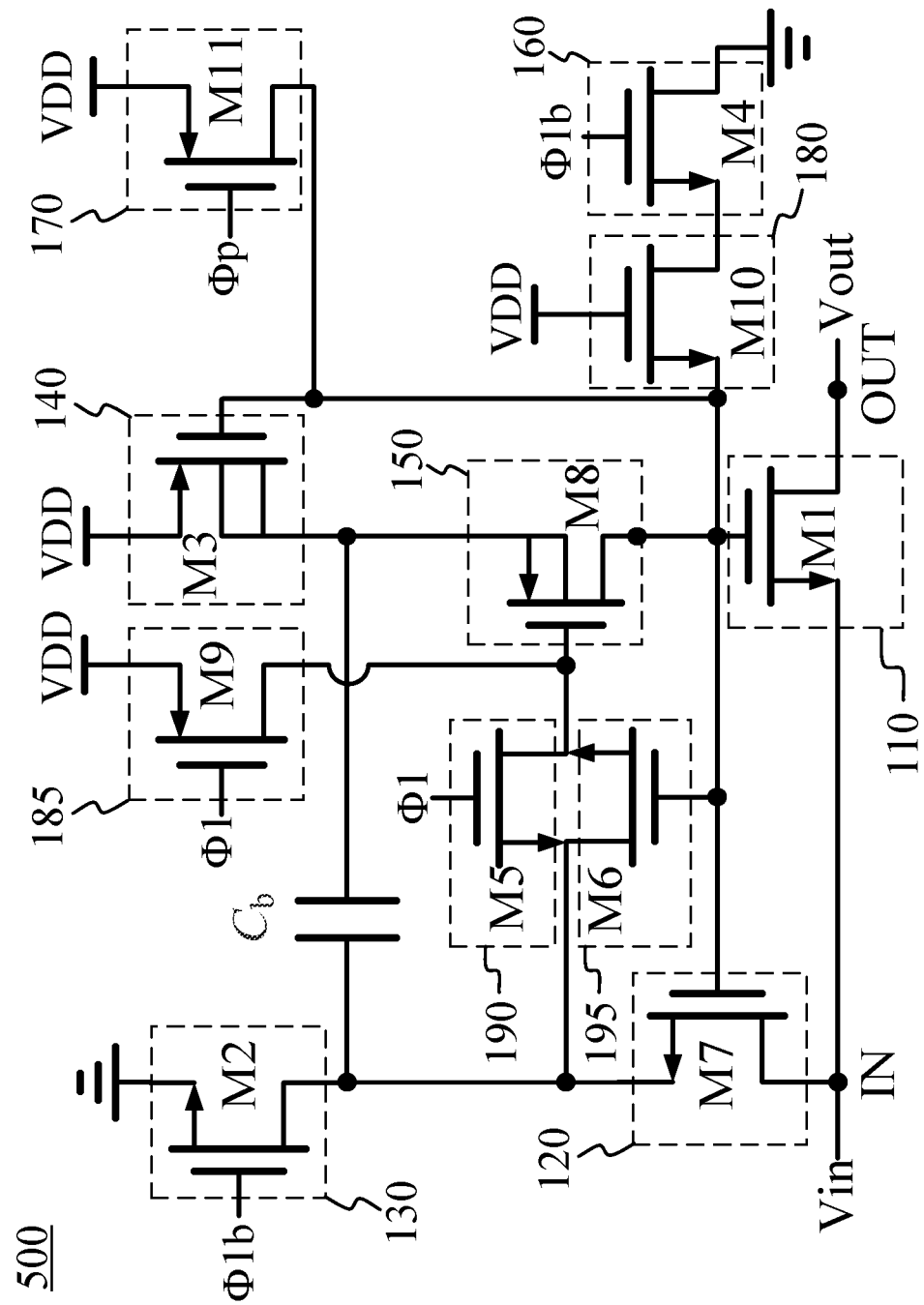
FIG. 6 illustrates a circuit diagram of a bootstrapped switch according to another embodiment of this disclosure.

FIG. 6 is a circuit diagram of a bootstrapped switch according to another embodiment of this disclosure. In comparison with the bootstrapped switch 400, the bootstrapped switch 500 further includes a switch 180, a switch 185, a switch 190 and a switch 195 which are implemented by the transistor M10, transistor M9, transistor M5 and transistor M6, respectively. The switch 180 is coupled between the control terminal of the transistor M1 and the switch 160, and the control terminal of the transistor M10 is coupled to the second reference voltage. The switch 185 is coupled between the second reference voltage and the control terminal of the transistor M8, and is controlled by the clock Φ1. The switch 190 is coupled between the first terminal of the bootstrap capacitor $C_b$ and the control terminal of the transistor M8, and is controlled by the clock Φ1. The switch 195 is coupled between the first terminal of the bootstrap capacitor $C_b$ and the control terminal of the transistor M8, and the control terminal of the transistor M6 is electrically connected to the control terminal of the transistor M1 and the control terminal of the transistor M7. The transistor M5, transistor M6, transistor M9 and transistor M10 are configured to provide overvoltage protection during the operation of the bootstrapped switch 500, for the purpose of prolonging the service life of the device. The operation detail of these transistors is well known to people having ordinary skill in the art and are thus omitted for brevity.

In reference to FIG. 6, when the switch 170 is not implemented, the turn-on process of the bootstrapped switch 500 must go through the following steps: the transistor M5 turning on, then the transistor M8 turning on, and finally the transistor M1 and transistor M7 turning on, which is a time consuming process. This problem, however, can be addressed by implementing the switch 170. This is because the switch 170 can change the voltages of the control terminals of the transistor M1 and transistor M7 in advance, so that the transistor M1 and transistor M7 are turned on immediately after the bootstrapped switch 500 enters the turn-on stage (i.e., the second clock phase Ph2). As a result, the bootstrapped switch 500 responds more quickly (i.e., having a shorter response time).

Figure 7:
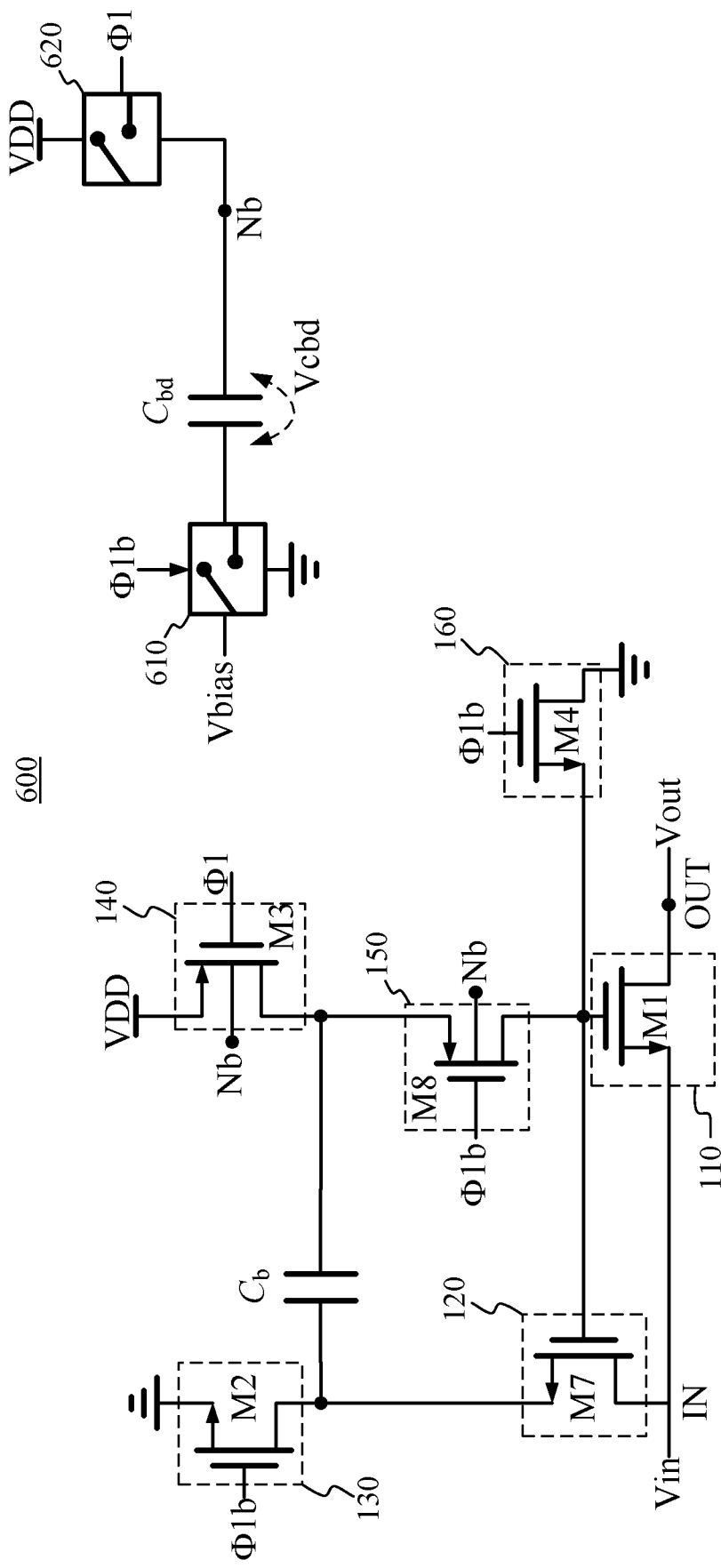
FIG. 7 illustrates a circuit diagram of a bootstrapped switch according to another embodiment of this disclosure.

FIG. 7 is a circuit diagram of a bootstrapped switch according to another embodiment of this disclosure. The bootstrapped switch 600 is similar to the bootstrapped switch 100, except that the bootstrapped switch 600 does not include the switch 170. Instead, the bootstrapped switch 600 includes a capacitor $C_{bd}$, a switch 610 and a switch 620. The first terminal of the capacitor $C_{bd}$ is coupled to the first reference voltage or the third reference voltage (i.e., Vbias) through the switch 610, and the second terminal of the capacitor $C_{bd}$ is coupled to the second reference voltage through the switch 620. The switch 610 and switch 620 are respectively controlled by the clock Φ1b and clock Φ1 in a way that the first and second terminals of the capacitor $C_{bd}$ are respectively coupled to the first reference voltage and the second reference voltage in the first clock phase Ph1, and the first terminal of the capacitor $C_{bd}$ is coupled to the third reference voltage and the second terminal of the capacitor $C_{bd}$ is not coupled to the second reference voltage in the second clock phase Ph2.

It should be noted that the bulk of the transistor M3 is not electrically connected to the first and second terminals of the transistor M3, and the bulk of the transistor M8 is not electrically connected to the first and second terminals of the transistor M8. In this embodiment, both the bulk of the transistor M3 and the bulk of the transistor M8 are electrically connected to the node Nb (i.e., the second terminal of the capacitor $C_{bd}$). In another embodiment, the node Nb may be electrically connected to one of the bulk of the transistor M3 and the bulk of the transistor M8, and the bulk that is not electrically connected to the node Nb is electrically connected to the first terminal or second terminal of the same transistor.

The capacitor $C_{bd}$ is charged in the first clock phase Ph1 so that when the first clock phase Ph1 ends, the voltage Vcbd across the capacitor $C_{bd}$ is substantially equal to the difference between the second reference voltage and the first reference voltage. In the second clock phase Ph2, the voltage Vnb of the node Nb is the sum of the voltage Vcbd across the capacitor $C_{bd}$ and the third reference voltage (i.e., Vnb=Vcbd+Vbias). Since the node Nb is electrically connected to the bulk of the transistor M3 and/or the bulk of the transistor M8, the charges on the capacitor $C_{bd}$ are distributed to the parasitic capacitor of the transistor M3 and/or the parasitic capacitor of the transistor M8 in the second clock phase Ph2. In other words, the parasitic capacitor(s) is/are charged in the second clock phase Ph2. Charging the parasitic capacitor of the transistor M3 and/or the parasitic capacitor of the transistor M8 with the charges on the capacitor $C_{bd}$ in the second clock phase Ph2 has the following benefits: The parasitic capacitor of the transistor M3 and/or the parasitic capacitor of the transistor M8 does/do not draw charges from the bootstrap capacitor $C_b$, which enables the voltage Vcb across the bootstrap capacitor $C_b$ to be substantially completely applied to the control terminal of the transistor M1.

Since the transistor M3 and the transistor M8 are both P-type metal-oxide-semiconductor field-effect transistors (P-type MOSFETs, hereinafter referred to as PMOSs), the voltage variation on the second terminal of the bootstrap capacitor $C_b$ in response to the change in the input voltage Vin is likely to cause forward biasing between the bulk of the transistor M3 (or transistor M8) and its drain or source in the second clock phase Ph2. Forward biasing may cause the transistor M3 (or transistor M8) to fail to operate normally. To prevent forward biasing from occurring, the voltage Vnb can be designed to be greater than or equal to the voltage of the second terminal of the bootstrap capacitor $C_b$, that is, Vcbd+Vbias≥Vin+Vcb.

In the embodiment of FIG. 7, the voltages Vcbd and Vcb are substantially the same (both being the difference between the second reference voltage and the first reference voltage). Therefore, as long as Vbias≥Vin is ensured, forward biasing will not occur to the transistor M3 and/or the transistor M8. In some embodiments, the third reference voltage (i.e., Vbias) may be substantially equal to the second reference voltage (i.e., the power supply voltage VDD) because in general the power supply voltage VDD is greater than or equal to the input voltage Vin.

Figure 8:
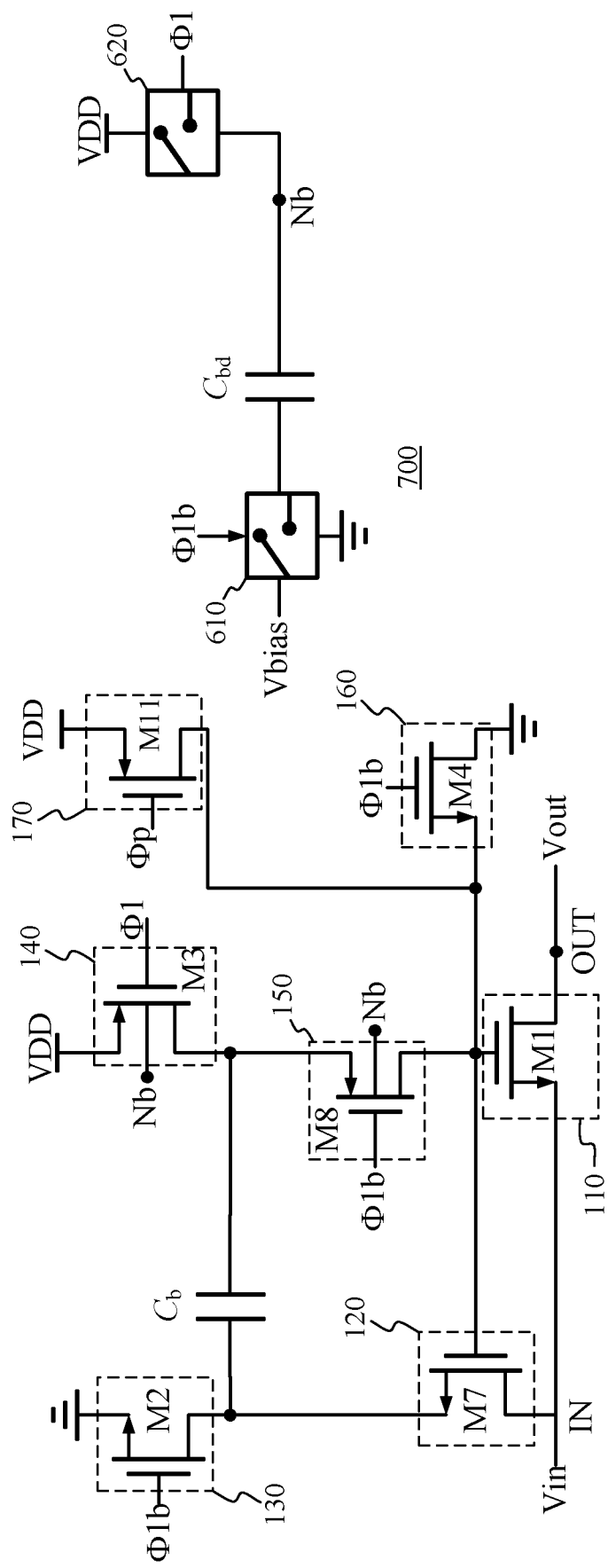
FIG. 8 illustrates a circuit diagram of a bootstrapped switch according to another embodiment of this disclosure.

The embodiment of FIG. 7 can be combined with the embodiment of FIG. 2, FIG. 5 or FIG. 6. For example, the bootstrapped switch 700 shown in FIG. 8 is a combination of the bootstrapped switch 600 and bootstrapped switch 100. People having ordinary skill in the art can implement the combination of the bootstrapped switch 600 and bootstrapped switch 400 and the combination of the bootstrapped switch 600 and bootstrapped switch 500 according to the above discussions, and the details are thus omitted for brevity.

The PMOSs and NMOSs in the above embodiments can be replaced with NMOSs and PMOSs, respectively, and people having ordinary skill in the art know how to realize the embodiments discussed above using the opposite type of MOSFET (i.e., replacing one type of MOSFETs with the other) by adjusting the phases or levels of the clock $\Phi 1$, clock $\Phi 1b$ and clock $\Phi p$ and adjusting the first, second and third reference voltages.

It should be noted that the shape, size, and ratio of any element in the disclosed figures are exemplary for understanding, not for limiting the scope of this disclosure.

The aforementioned description represents merely the preferred embodiments of this disclosure, without any intention to limit the scope of this disclosure thereto. Various equivalent changes, alterations, or modifications based on the claims of this disclosure are all consequently viewed as being embraced by the scope of this disclosure.

What is claimed is:

1. A bootstrapped switch, receiving an input voltage and outputting an output voltage, comprising:
   a first transistor, having a first terminal, a second terminal and a first control terminal, wherein the first terminal receives the input voltage, and the second terminal outputs the output voltage;
   a capacitor, having a third terminal and a fourth terminal;
   a second transistor, having a fifth terminal, a sixth terminal and a second control terminal, wherein the fifth terminal receives the input voltage, the sixth terminal is electrically connected to the third terminal of the capacitor, and the second control terminal is electrically connected to the first control terminal of the first transistor;
   a first switch, coupled between the third terminal of the capacitor and a first reference voltage;
   a second switch, coupled between the fourth terminal of the capacitor and a second reference voltage;
   a third switch, coupled between the fourth terminal of the capacitor and the first control terminal of the first transistor;
   a fourth switch, coupled between the first control terminal of the first transistor and the first reference voltage; and
   a fifth switch, coupled between the first control terminal of the first transistor and the second reference voltage;
   wherein the capacitor is charged in a first clock phase with the first switch, the second switch and the fourth switch being turned on and the third switch being turned off;
   wherein in a second clock phase, the third switch is turned on, and the first switch, the second switch and the fourth switch are turned off, so that the first control terminal of the first transistor and the fourth terminal of the capacitor are substantially equipotential;
   wherein the fifth switch is turned on in a preset time interval before the first clock phase ends or in the preset time interval after the second clock phase starts, so that the first control terminal of the first transistor and the second control terminal of the second transistor are coupled to the second reference voltage in the preset time interval.

2. The bootstrapped switch of claim 1, wherein the second switch is a transistor having a seventh terminal, an eighth terminal and a third control terminal, the seventh terminal being coupled to the second reference voltage, the eighth terminal being coupled to the fourth terminal of the capacitor, and the third control terminal receiving a clock.

3. The bootstrapped switch of claim 1, wherein the second switch is a transistor having a seventh terminal, an eighth terminal and a third control terminal, the seventh terminal being coupled to the second reference voltage, the eighth terminal being coupled to the fourth terminal of the capacitor, and the third control terminal being electrically connected to the first control terminal of the first transistor.

4. A bootstrapped switch, receiving an input voltage and outputting an output voltage, comprising:
   a first transistor, having a first terminal, a second terminal and a first control terminal, wherein the first terminal receives the input voltage, and the second terminal outputs the output voltage;
   a first capacitor, having a third terminal and a fourth terminal;
   a second transistor, having a fifth terminal, a sixth terminal and a second control terminal, wherein the fifth terminal receives the input voltage, the sixth terminal is electrically connected to the third terminal of the first capacitor, and the second control terminal is electrically connected to the first control terminal of the first transistor;
   a first switch, coupled between the third terminal of the first capacitor and a first reference voltage;
   a third transistor, having a seventh terminal, an eighth terminal and a first bulk, wherein the seventh terminal is coupled to a second reference voltage, and the eighth terminal is coupled to the fourth terminal of the first capacitor;
   a fourth transistor, having a ninth terminal, a tenth terminal and a second bulk, wherein the ninth terminal is coupled to the first control terminal of the first transistor, and the tenth terminal is coupled to the fourth terminal of the first capacitor;
   a second switch, coupled between the first control terminal of the first transistor and the first reference voltage; and
   a second capacitor, having an eleventh terminal and a twelfth terminal, wherein the twelfth terminal is electrically connected to the first bulk and/or the second bulk;
   wherein the first capacitor is charged in a first clock phase with the first switch being turned on, the third transistor being turned on, the second switch being turned on, and the fourth transistor being turned off;
   wherein in a second clock phase, the fourth transistor is turned on, the first switch is turned off, the third transistor is turned off, and the second switch is turned off, so that the first control terminal of the first transistor and the fourth terminal of the first capacitor are substantially equipotential;
   wherein the second capacitor is charged in the first clock phase, the eleventh terminal of the second capacitor is coupled to a third reference voltage in the second clock phase, and in the second clock phase a sum of a first voltage across the first capacitor and the input voltage is less than or equal to a sum of a second voltage across the second capacitor and the third reference voltage.

5. The bootstrapped switch of claim 4, wherein the third transistor is a P-type metal-oxide-semiconductor field-effect transistor (MOSFET), and the first bulk is not electrically connected to the seventh terminal and the eighth terminal.

6. The bootstrapped switch of claim 4, wherein the fourth transistor is a P-type metal-oxide-semiconductor field-effect transistor (MOSFET), and the second bulk is not electrically connected to the ninth terminal and the tenth terminal.

7. The bootstrapped switch of claim 4 further comprising:
a third switch, coupled between the first control terminal of the first transistor and the second reference voltage;
wherein the third switch is turned on in a preset time interval before the first clock phase ends or after the second clock phase starts, so that the first control terminal of the first transistor and the second control terminal of the second transistor are coupled to the second reference voltage in the preset time interval.

8. The bootstrapped switch of claim 7, wherein the third transistor further has a third control terminal, and the third control terminal receives a clock.

9. The bootstrapped switch of claim 7, wherein the third transistor further has a third control terminal, and the third control terminal is electrically connected to the first control terminal of the first transistor.

10. A bootstrapped switch, having an input terminal and an output terminal, comprising:
a first transistor, coupled between the input terminal and the output terminal and having a first control terminal;
a capacitor, having a first terminal and a second terminal;
a second transistor, coupled between the input terminal and the first terminal of the capacitor and having a second control terminal, wherein the second control terminal is electrically connected to the first control terminal of the first transistor;
a plurality of switches, coupled to the first control terminal of the first transistor, the second control terminal of the second transistor, the first terminal of the capacitor, the second terminal of the capacitor, a first reference voltage and a second reference voltage, and comprising a first group and a second group; and
a target switch, coupled between the first control terminal of the first transistor and the second reference voltage;
wherein the capacitor is charged in a first clock phase with the first group of the switches being turned on and the second group of the switches being turned off;
wherein in a second clock phase, the first group of the switches is turned off, and the second group of the switches is turned on, so that the first control terminal of the first transistor and the second terminal of the capacitor are substantially equipotential;
wherein the target switch is turned on in a preset time interval before the first clock phase ends or after the second clock phase starts, so that the first control terminal of the first transistor and the second control terminal of the second transistor are coupled to the second reference voltage in the preset time interval.

* * * * *